United States Patent [19]

Hsu

[11] 4,332,077
[45] Jun. 1, 1982

[54] METHOD OF MAKING ELECTRICALLY PROGRAMMABLE CONTROL GATE INJECTED FLOATING GATE SOLID STATE MEMORY TRANSISTOR

[75] Inventor: Sheng T. Hsu, Lawrenceville, N.J.

[73] Assignee: RCA Corporation, New York, N.Y.

[21] Appl. No.: 284,106

[22] Filed: Jul. 16, 1981

Related U.S. Application Data

[62] Division of Ser. No. 65,436, Aug. 10, 1979, Pat. No. 4,297,719.

[51] Int. Cl.³ .......................................... H01L 21/26
[52] U.S. Cl. .................................. 29/571; 29/576 B; 29/580; 29/591; 148/187
[58] Field of Search ..................... 29/571, 576 B, 580, 29/591; 148/1.5, 187; 357/23 VT

[56] References Cited

U.S. PATENT DOCUMENTS

| | | | |
|---|---|---|---|
| 4,259,779 | 4/1981 | Ipri et al. | 29/571 |
| 4,272,880 | 6/1981 | Pashley | 29/571 |
| 4,295,265 | 10/1981 | Horiuchi et al. | 29/571 |
| 4,296,426 | 10/1981 | Gilles | 29/571 X |

Primary Examiner—G. Ozaki
Attorney, Agent, or Firm—Birgit E. Morris; Donald S. Cohen; Lawrence P. Benjamin

[57] ABSTRACT

A non-volatile memory structure of the floating gate type is described wherein current carriers are injected onto the floating gate from the control gate as distinguished from the prior art which injects current carriers into the floating gate from the substrate. This invention teaches that by tailoring the capacitance between the control gate and the floating gate and the capacitance between the floating gate and the substrate different field intensities are created in the region between the floating gate and the control gate and in the region between the substrate and the floating gate. When the field intensity across the capacitor formed between the control gate and the floating gate is greater than the field intensity across the capacitor formed between the floating gate and the substrate, current carriers will be injected onto the floating gate from the control gate.

6 Claims, 7 Drawing Figures

METHOD OF MAKING ELECTRICALLY PROGRAMMABLE CONTROL GATE INJECTED FLOATING GATE SOLID STATE MEMORY TRANSISTOR

This is a division of application Ser. No. 65,436 filed Aug. 10, 1979 now U.S. Pat. No. 4,297,719.

BACKGROUND OF THE INVENTION

This invention relates, in general, to non-volatile memory structures and more particularly to a novel electrically alterable floating gate injected device.

The computer and related art have long required read-only memory (ROM) elements that were non-volatile and the prior art has provided many devices which, to some extent, have tempted to fill this need to varying degrees. However, since the computer art has progressed in complexity there now exists a need to provide electrically alterable read-only memories that may be programmed (or "written") and, if the occasion arises to reprogram (erase and write) in the field. To this end, devices are presently available that exhibit non-volatile characteristics but, as will be discussed, they each have inherent shortcomings that are overcome by the subject invention.

At one end of the spectrum of semiconductor memory devices is the family of Floating gate-Avalanche-Metal-Oxide Semiconductor (FAMOS) devices while the other end of the spectrum is represented by the family of Metal-Nitride-Oxide Semiconductor (MNOS) devices. The advantages of each type of device resides in the fact that they are independent of any outside power (current or voltage) to maintain the stored information in the event power is lost, and since they are independent of any outside power, there is no need for any further refreshing of the device. Hence, there is a significant saving in the power necessary to operate the device.

The floating gate family of devices usually has source and drain regions of one conductivity formed in a substrate of the opposite conductivity, at the surface thereof. Between the source and the drain regions, and on the surface of the substrate, a gate structure is created by first forming a thin oxide layer on the surface of the substrate between the source and the drain regions (the channel region). A conductive layer is then placed over the insulating layer and constitutes the floating gate. A second insulating layer is then formed over the floating gate to completely surround the floating gate and insulate it from the remainder of the device followed by a second conductive layer (the control gate) which is formed atop the second insulating layer. Such floating gate devices, which are exemplified in U.S. Letters Pat. No. 3,500,142 and 3,755,721, have inherent drawbacks in that high fields are required to produce the necessary avalanche breakdown from the substrate to the floating gate so that a charge will appear on the floating gate. Further, to erase the charge trapped on the floating gate, the entire device is usually flooded with energy in the ultraviolet or x-ray portion of the spectrum. Thus, it is extremely difficult, bordering on the impossible, to erase a single "word" without erasing all the charge on the remainder of the device, thereby requiring the device to be completely reprogrammed. However, other serious defects are manifest in both FAMOS and MNOS devices. For example, both prior art type devices show a marked tendency toward zener breakdown at the drain-substrate junction particularly at high voltages. Further, since charge is placed on the floating gate (and nitride layer) by means of electrons or holes flowing through the thin layer of gate oxide material it has been found that after relatively few charge and discharge (write and erase) cycles has been accomplished, the user is faced with a radical change in the threshold voltage of the device, a situation which, in many instances, may require the replacement of the device. It is theorized that the holes and electrons during transit through the thin gate oxide layer disrupts the layer to the extent that the threshold voltage is markedly raised.

SUMMARY OF THE INVENTION

In accordance with the invention a non-volatile memory structure of the floating gate type is described wherein the capacitance between the floating gate and the substrate and the capacitance between the control gate and the floating gate is tailored in such a manner as to inject current carriers into the floating gate from the control gate as distinguished from the prior art which injects current carriers into the floating gate from the substrate thereby destroying the integrity of the gate oxide.

In my previously filed application, Ser. No. 864,766, filed on Dec. 27, 1977, now U.S. Pat. No. 4,162,504 entitled FLOATING GATE SOLID STATE STORAGE DEVICE and assigned to the same assignee as the subject application, I described and claimed a solid state floating gate device wherein the floating and control gates are uniform with respect to each other and with respect to the channel area. In the subject application, the floating gate is positioned at the side of the channel region adjacent the source region and extends only over a portion of the channel region. The control gate is insulated from the floating gate and is positioned so as to extend over only a portion of the floating gate and over the remainder of the channel region not occupied by the floating gate. The edge of the floating gate adjacent the source region (the trailing edge) is aligned with the source-channel junction while the far end of the control gate (the leading edge) is aligned with the drain channel junction.

Figure 3:
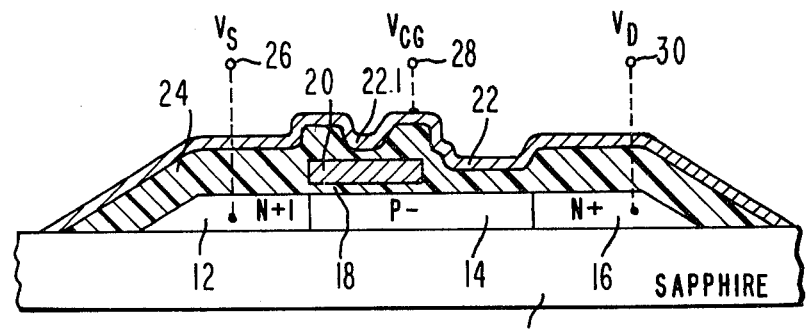
FIG. 3 is still another cross-sectional view of another embodiment of a floating gate device utilizing a control gate that extends the length of the silicon island in a silicon-on-sapphire device.
Figure 4:
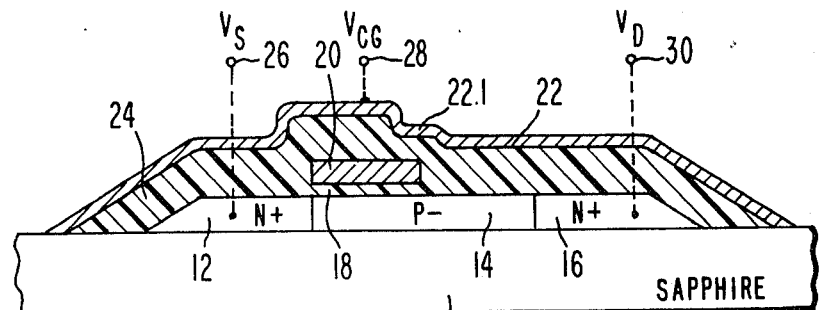
FIG. 4 is another cross-sectional view of still another silicon-on-sapphire embodiment of my device wherein the control extends the length of the silicon island.

It should be noted that while the foregoing exegesis with regard to FIGS. 1, 3, and 4 will be discussed in terms of a silicon-on-sapphire (SOS) device, it will be obvious to those skilled in the art that while sapphire is preferred, other similar insulative substrates such as monocrystalline beryllium oxide and spinel may be used. Further, while the structure shown in FIGS. 1–4 are described as N-channel devices, it is understood that this is only by way of example since the conductivities of the various elements may be changed without departing from the inventive concept.

DETAILED DESCRIPTION OF THE INVENTION

Figure 1:
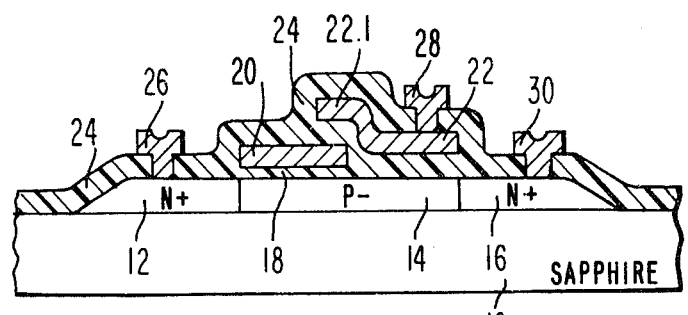
FIG. 1 is a cross-sectional view of one embodiment of my invention in which a silicon-on-sapphire device is presented.

Referring now to FIG. 1, there is shown a semiconductor device having an insulative substrate 10 which may, for example, be selected from the group consisting of sapphire, monocrystalline beryllium oxide or spinel. As is well known in the SOS art a layer of intrinsic monocrystalline silicon is first deposited on the sapphire substrate 10 and then formed or defined into discrete islands. In the example shown, the silicon island has a source region 12, a drain region 16 and an intervening channel region 14. In this instance, drain and source regions 16 and 12, respectively have N type conductivity modifiers therein while channel region 14 is P type. A layer of gate oxide material 18 is formed on the top surface of the island and is used to insulate floating gate 20 from the remainder of the island. A layer of field oxide 24 covers the floating gate 20 and is used to insulate the floating gate from the control gate 22. Note that the portion of the control gate 22 that overlaps the floating gate 20 is labelled 22.1 and will be hereinafter referred to as the write-erase window. To complete the device a passivating or overcoat layer of silicon oxide is placed over the entire structure and is similar to the oxide originally grown as insulating material 24. To complete the device contacts 26, 28, and 30 are formed in ohmic contact with source region 12, control gate 22 and drain region 16, respectively.

Figure 1A:
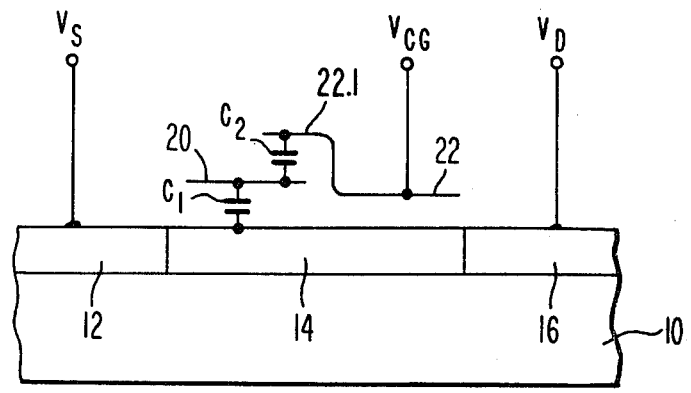
FIG. 1A is a schematic representation of the device of FIG. 1 in order to more clearly depict the capacitance distribution for ease of explanation.

Referring now to FIG. 1A for a schematic representation of the capacitance distribution that exists in the subject device, it will be seen that capacitance $C_1$ is formed between floating gate 20 and the substrate or island while capacitance $C_2$ is formed between the write-erase window portion 22.1 of control gate 22 and floating gate 20. Thus, when for example, a voltage $V_g$ is applied to control gate 22, the voltage at the floating gate ($V_f$) may be expressed as $$V_f = \frac{V_g C_2}{C_1 + C_2}.$$

Similarly, the voltage drop appearing between control gate 20 and the write-erase window 22.1 ($V_{fg}$) may be expressed as $$V_{fg} = \frac{V_g C_1}{C_1 + C_2}.$$

The capacitance may also be expressed as the product of the area (A) times the dielectric constant of the $SiO_2$ insulator ($\epsilon$) divided by the thickness of the insulator (t) or $C = A\epsilon/t$. Thus, in the case of $C_1$, this capacitance is formed by the entire area under floating gate 20 while the capacitance of $C_2$ is governed by the area of overlap, that is, the area subtended under the write-erase window portion 22.1. In this instance, $C_1$ is considerably larger than $C_2$ since the area of $C_1$ is considerably larger than the area of $C_2$. Thus, the field intensity of the region between the floating gate and the control gate is much larger than the field intensity of the region between the substrate and the floating gate. In other words, the field intensity across $C_2$ is much greater than the field intensity across $C_1$. This serves to reduce the voltage required to inject current carriers into the floating gate from the control gate.

Figure 2:
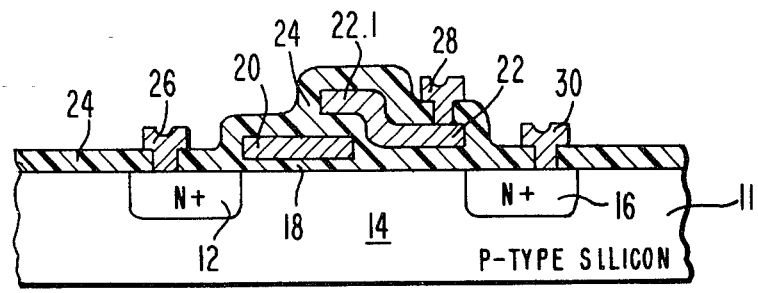
FIG. 2 is another embodiment of my invention, shown in cross-section utilizing bulk silicon.

Referring now to FIG. 2 there is shown a structure that is similar to that of FIG. 1 differing only that it uses bulk silicon. In this embodiment, a body of bulk silicon 11, having a given concentration of conductivity modifiers therein has certain areas 12 and 16 formed therein which areas constitute the source and drain regions, respectively, with the resultant channel region 14 being formed therebetween. Gate oxide layer 18 is provided on the upper surface of silicon body 11 having a thickness of about 100–200 Å. The top surface of gate oxide 18 is provided with floating gate 20 which is formed, as in FIG. 1, to extend only partially across channel region 14. The trailing edge of floating gate 20 is aligned with the drain-channel junction while the leading edge thereof terminates somewhere midway between the drain and source region. Floating gate 20 is then provided with an insulating layer 24 thereover which conforms to the raised profile of the floating gate. Thereafter, control gate 22 is formed so that its trailing edge partially overlaps a portion of floating gate 20 at the leading edge of floating gate 20. Control gate 20 is positioned so that its leading edge is aligned with the drain-channel junction region. The control gate is, thus, insulated from the floating gate and the floating gate-control gate combination is aligned with channel portion 14. The entire device is then provided with a cover or passivating layer of $SiO_2$ (a continuation of $SiO_2$ layer 24) and provided with contacts 26, 28, and 30 which are in ohmic contact with the source region 12, control gate 22, and drain region 16, respectively. It should be here noted that since the configuration and function of the floating gate and the control gate in FIG. 2 are similar to the similarly numbered floating gate and control gate of FIG. 1 that the method of operation of the device of FIG. 2 can be readily understood by reference to the schematic representation as shown in FIG. 1A.

Referring now to FIG. 3 there is shown a device that has particular utility in a Large Scale Integrated (LSI) array. In LSI arrays, the control gate usually has to run perpendicular to the source and drain lines. The structure of my invention allows one to construct an LSI array where every memory cell can be addressed independently. As seen in FIG. 3, the island having source 12, drain 16 and the intervening channel region 14 is affixed to a sapphire substrate 10. Floating gate 20 is insulated from the island by means of a layer of gate oxide 18 and is insulated from the control gate 22 by means of an oxide layer 24. In this embodiment, as distinguished from the embodiments presented in FIGS. 1 and 2, control gate 22 runs perpendicular to source and drain lines 12 and 16, respectively, and is nonuniformly spaced away from floating gate 18. The thin section of insulator under write-erase window 22.1 serves as the principal capacitance between floating gate 18 and control gate 22 as will be seen in FIG. 3A. As in the previous embodiments, source 12 and drain 16 are provided with appropriate connections herein indicated 26 and 30, respectively and labelled $V_S$ and $V_D$. Also, the connection to the control gate is shown as terminal 28 and labelled $V_{CG}$. As in the prior embodiments, FIG. 3 is provided with a write-erase window 22.1, the operation of which is discussed in detail in FIG. 3A.

Figure 3A:
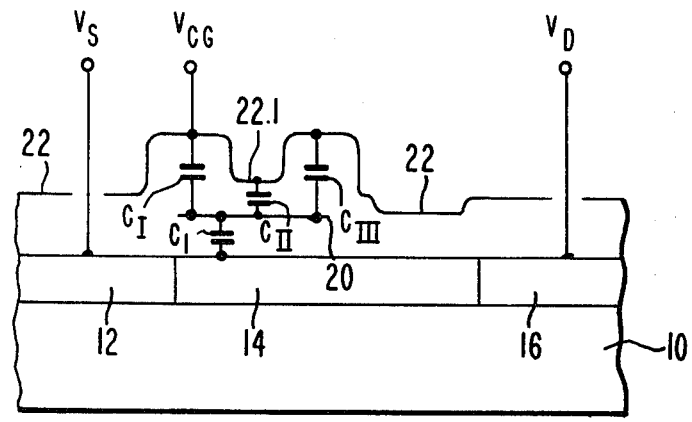
FIG. 3A is a schematic representation of the capacitance distribution of the embodiment of FIG. 3.

Referring now to FIG. 3A a schematic representation of the capacitance is distributed throughout the embodiment of FIG. 3, it will be seen that $C_1$ represents the capacitance between the floating gate and the substrate, while $C_{II}$, $C_I$ and $C_{III}$ is equal to $C_2$. Thus, while $C_2$ is equal to the sum of $C_I$, $C_{II}$ and $C_{III}$, the $C_2$ capacitance will be primarily determined by $C_{II}$ since $C_I$ and $C_{III}$ are small by comparison. Accordingly, the criterion previously set, namely that the capacitance of $C_1$ must be considerably greater than the capacitance of $C_2$, has been met. Since $C_1 >> C_2$, the field intensity at the region between floating gate 20 and control gate 22 will be much larger than the field intensity induced in the region between the substrate and floating gate 20. Accordingly, current carriers will be injected into the floating gate from the control gate and not from the substrate.

Figure 4A:
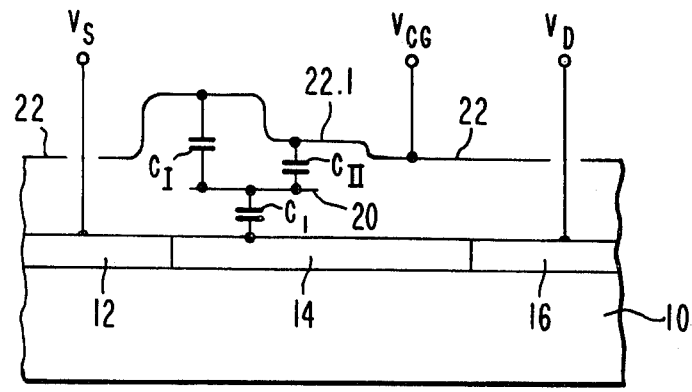
FIG. 4A is a schematic representation of the capacitance distribution of the embodiment of FIG. 4.

Referring now to FIG. 4 there is shown still another embodiment which, in most respects, is identical to that of the embodiment presented in FIG. 3. The difference between the embodiments presented in FIGS. 3 and 4 resides in the configuration of the control gate (in the vertical plane). FIG. 4 is configured to have only a pair of capacitors $C_I$ and $C_{II}$. In this embodiment as in the previous embodiments, similar elements are similarly numbered. As in the embodiment of FIG. 3, the island consisting of a source region 12, channel region 14 and drain region 16 are formed on the surface of sapphire substrate 10. Usual ohmic connections 26, 28, and 30 are made to source 12, control grid 22, and drain region 16, respectively. Floating gate 20 is insulated from substrate by the presence of the gate oxide 18, while floating gate 20 is insulated from the control gate by means of insulator 24. In this latter embodiment, when viewed in conjunction with FIG. 4A, there is shown a pair of capacitors $C_I$ and $C_{II}$ the sum of which constitutes $C_2$. As in the previous embodiments, $C_2$ is smaller than $C_1$ due to the fact that the area under write-erase window 22.1 is the principal capacitance between floating gate 18 and control gate 22 and effectively determines the $C_2$ capacitance. Accordingly, the field intensity in the region between floating gate 20 and control gate 22.1 will be much larger than the field intensity between the substrate and floating gate 22. Thus, current carriers are injected into the floating gate from the control gate.

While there may be other methods of manufacturing semiconductor devices that might have applicability in this invention, the following explanation will be given for a method of manufacturing each of the preferred embodiments which I have found to be successful. Further, while the following exegesis will be described in terms of, for example, an N channel device, it should be obvious to those skilled in the art that with only a slight, obvious modification, the same processing could apply to a P channel device.

Referring now to the embodiment shown and described with regard to FIG. 1, it will be seen that a sapphire substrate 10 is provided having a broad flat surface on which a layer of intrinsic silicon is deposited in a well-known manner. The thickness of the silicon layer is of the order of 0.5–0.6 micrometers thick and is formed by the thermal decomposition of silane in a hydrogen atmosphere. Thereafter, the layer of silicon is formed into islands in a well-known manner. Since this device will be described in terms of an N channel device it is now necessary to introduce P type conductivity modifiers into the silicon island to form what will later be recognized as channel region 14. This is done by doping or implanting with, for example, boron in a well-known manner. The resultant structure will be an island of silicon having P type conductivity modifiers therein on a sapphire substrate.

The next step in the process is to form gate oxide layer 18 to a thickness of about 100–200 Å, and this layer of oxide may be formed either by the thermal oxidation of the silicon island utilizing dry oxygen at about 900° C. or by the thermal decomposition of silane in an oxidizing atmosphere. Having formed gate oxide layer 18, a layer of polycrystalline silicon (polysilicon) is formed over the gate oxide in order to provide a floating gate. This layer of polysilicon is formed by means of a low pressure chemical vapor deposition process and is continued until the layer of polysilicon floating gate material achieves a thickness of about 2000 Å. The polysilicon layer is then masked in order to define the length and width of floating gate 20 and define the limits of the dimensions thereof and is then etched in a hot ethylene diamene pyrocatechol and water solution at a temperature approaching the boiling point of the etchant. This then defines the leading and trailing edges of floating gate 20 in FIGS. 1 and 2.

Thereafter, a second layer of oxide 24 is grown over the now-defined floating gate 20 to a thickness of about 800–900 Å and may, for example, be accomplished by utilizing wet oxygen (steam) at 900° C. for about 40 minutes. The net result of this step will be the production of an oxide layer having a thickness of about 800–900 Å immediately above floating gate 20 and conforming to the outline thereof and a somewhat greater thickness over that portion of the channel region not covered by floating gate 20 as well as the remainder of the island.

The next step in the process is the formation of the control gate 22. This is accomplished by first depositing a layer of polysilicon to a thickness of about 5000 Å utilizing, as before, for example, a low pressure chemical vapor deposition process. This second polysilicon layer is then masked and appropriately etched with the same type of etchant solution previously mentioned with regard to the formation of floating gate 20. The masking, in this instance, is such that the trailing edge of the control gate 22 partially overlaps floating gate 18 at the leading edge portion thereof while the leading edge of control gate 22 is terminated in a position so as to define, in the next following steps, the edge of drain region 16.

Since the device will be an N channel device, it is now necessary to provide both source 12 and drain 16 with suitable conductivity modifiers. This is accomplished by ion implantation through the layer of oxide 24. Further, as the device is irradiated or subjected to the ion implantation, control gate 22 and floating gate 20 are also implanted. In this instance, both source 12, drain 16, floating gate 20, and control gate 22 are all implanted with phosphorus type conductivity modifiers and are represented as N+ source and drain regions 12 and 16, respectively. Thereafter, to complete the array another layer of silicon oxide is deposited over the entire structure to a thickness of about 6000 Å. This last-mentioned oxide layer may also be done by a chemical vapor deposition. The last-mentioned oxide coating could be intensified in an oxygen ambient. The structure is now again masked so as to form contact openings and the openings suitably etched down to source region 12, control gate 22, and drain region 16 and subsequently metallized in a manner so as to provide the source 12, control gate 22, and drain 16 with metallized ohmic contacts 26, 28, 30, respectively.

The fabrication of the device of FIG. 2 is similar to that of the device of FIG. 1. However, it should be obvious, that instead of utilizing a silicon-on-sapphire substrate, the fabrication is commenced with a P type silicon body after which the layer of gate oxide is formed thereon, followed by the formation of floating gate 20. Thereafter, the fabricating steps are similar to that previously described with regard to FIG. 1.

It should be here noted that with the fabrication process as previously described with regard to FIGS. 1 and 2, that during the ion implantation step to form source 12, drain 16 and to dope floating gate 20 and control gate 22, that by utilizing the ion implantation step, the overlap of section 22.1 of control gate 22 will, in effect, shade a portion of floating gate 20, and thereby prevent any conductivity modifiers from being implanted into floating gate 20. This has the enhanced effect of reducing the voltage required to inject current carriers into floating gate from the control gate. In the alternative, it will be seen that source and drain regions 12 and 16, respectively can be formed and thereafter the layer of polysilicon is deposited to form floating gate 20. After floating gate 20 has been defined to set its limits, it may be doped by diffusion. Similarly, after the formation of the control gate 22 it, also, may be individually doped.

Referring now to FIGS. 3 and 4 it should be obvious to those skilled in the art that these devices can be fabricated using much of the same technique previously utilized with regard to FIGS. 1 and 2. Namely, the island is deposited on a sapphire substrate and the dimensions of the silicon island are defined by appropriately masking and etching. Thereafter, the layer of gate oxide 18 is formed over the entire surface of the island followed by the steps which forms floating gate 20. In the embodiment of FIGS. 3 and 4 it is preferred that the floating gate initially extend the entire length of the region that will be subsequently defined as channel region 14. After floating gate 20 has been formed, floating gate 20, source 12, and drain 16 are doped by ion implantation utilizing a phosphorus type dopant as conductivity modifier. It will thus become obvious that an aligned source region 12 is formed and drain 16 is also formed. Thereafter, the floating gate 20 is masked and the undesired portions removed so that floating gate 20 extends only partially across channel region 14 with a trailing edge thereof aligned with the source-channel junction. Thereafter, oxide layer 24 is formed utilizing a chemical vapor deposition technique as previously described with regard to FIGS. 1 and 2. Upon completion of this step, the top surface of oxide layer 24 is appropriately masked wherein the unmasked portions define write-erase window 22.1 in both FIGS. 3 and 4. Thereafter, the unmasked portions at 22.1 are suitably etched and a thin oxide is regrown in order to form the write-erase windows. The next step is the formation of control gate 22 which is to extend, in a strip, over the length of the island. Thereafter, as in the previous embodiments, the device is provided with a passivating or overcoat layer of oxide (not shown) which is masked and etched to provide contact openings which are then metallized to form contacts 26, 28, and 30 in ohmic contact with drain region 12, control gate 22, and source region 16, respectively.

What is claimed is:

1. A method of forming a non-volatile memory structure comprising the steps of:
    forming a first layer of insulating material on a surface of a body of semiconductor material of a first conductivity type;
    forming a polycrystalline silicon floating gate member over the layer of insulating material, the floating gate member having a leading edge and a trailing edge, the region of the body of semiconductor material underlying the floating gate member representing the channel region;
    forming a second layer of insulating material over the floating gate member;
    forming a polycrystalline silicon control gate member having a leading edge and a trailing edge over the second layer of insulating material, the trailing edge thereof overlapping a portion of the leading edge of the floating gate member;
    forming source and drain regions of an opposite conductivity type in the body of semiconductor material with the trailing edge of the floating gate member aligned with the junction of the source and channel regions and the leading edge of the control gate member aligned with the junction of the drain and channel regions.

2. The method of claim 1, wherein:
    portions of the semiconductor body and both gate members are simultaneously doped with conductivity modifiers of the opposite type to form the source and drain regions and the floating gate and control gate members.

3. The method of claim 1 comprising the further steps of:
    forming the source and drain regions and the floating gate member by ion implantation;
    masking a portion of the floating gate member at the trailing edge thereof;
    removing a portion of the floating gate member at the unmasked leading edge thereof; and
    removing the mask prior to forming the second insulating layer.

4. The method of claim 3 comprising the further steps of:
    masking a portion of the second insulating layer;
    etching the unmasked portion of the second insulating layer to expose a portion of the floating gate member;
    regrowing a thin layer of insulating material on the exposed portion of the floating gate member; and
    removing the mask prior to forming the control gate member.

5. The method of claim 4, wherein:
    the unmasked portion of the second insulating layer is positioned over the central portion of the floating gate member.

6. The method of claim 4, wherein:
    the unmasked portion of the second insulating layer is adjacent the leading edge portion of the floating gate member.

* * * * *